United States Patent [19]

Okamoto

[11] Patent Number: 5,787,121

[45] Date of Patent: Jul. 28, 1998

[54] DATA TRANSMISSION SYSTEM

[75] Inventor: Shingo Okamoto, Tokyo, Japan

[73] Assignee: NEC Corporation, Tokyo, Japan

[21] Appl. No.: 773,950

[22] Filed: Dec. 26, 1996

[30] Foreign Application Priority Data

Dec. 27, 1995 [JP] Japan .................. 7-340714

[51] Int. Cl.[6] .................................................. H04L 5/12
[52] U.S. Cl. .................................. 375/262; 371/43.1
[58] Field of Search .................... 375/260, 261, 375/262, 279, 281, 308; 371/43.1

[56] References Cited

U.S. PATENT DOCUMENTS 5,384,809  1/1995  Yagi et al. ................... 375/261
5,555,547  9/1996  Lemaitre et al. ............. 375/262

FOREIGN PATENT DOCUMENTS 60-38957   2/1985  Japan .
61-137447  6/1986  Japan .

*Primary Examiner*—Temesghen Ghebretinsae
*Attorney, Agent, or Firm*—Foley & Lardner

[57] ABSTRACT

A data transmission system provides outputs having order of bit strings consistent with input bit strings input to an encoder even when erroneous bit strings are output due to frequency division ambiguity. Encoders are arranged in parallel at a transmission side. The arrangement of encoded bit strings input to a parallel/serial converter and respective decoded bit strings input to Viterbi decoder, is made an arrangement disabling error correcting decoding of any one of the decoded for disabling error correction decoding when erroneous bit string is output due to frequency phase ambiguity. The system includes a phase shifter for causing shifting of decoded bit strings to make the decoded bit strings consistent with the arrangement of input bits of the encoder, when error correction decoding is disabled. Also, when four phase ambiguity is caused, the arrangement of the output bit string of the Viterbi decoder is corresponding to the input bit strings of the encoder by a selector. By such constructions, outputs of the order of bit strings can be consistent with those input to encoders, even when bit strings are output in erroneous order due to frequency division phase ambiguity in serial/parallel converters.

10 Claims, 16 Drawing Sheets

FIG. 4

| | | | |
|---|---|---|---|
| T01 | D11 | D12 | D13 |
| T02 | D21 | D22 | D23 |
| T03 | D31 | D32 | D33 |
| T04 | D41 | D42 | D43 |
| T11 | X11 | X12 | X13 |
| T12 | Y11 | Y12 | Y13 |
| T13 | X21 | X22 | X23 |
| T14 | Y21 | Y22 | Y23 |
| T15 | X31 | X32 | X33 |
| T16 | Y31 | Y32 | Y33 |
| T17 | X41 | X42 | X43 |
| T18 | Y41 | Y42 | Y43 |

| | | | | | | | | | | | | |
|---|---|---|---|---|---|---|---|---|---|---|---|---|
| T21 | X11 | X21 | X31 | Y31 | X12 | X22 | X32 | Y32 | X13 | X23 | X33 | Y33 |
| T22 | Y11 | Y21 | X41 | Y41 | Y12 | Y22 | X42 | Y42 | Y13 | Y23 | X43 | Y43 |

FIG.5

| | | | | | | | | | | | | |
|---|---|---|---|---|---|---|---|---|---|---|---|---|
| R11 | RX11 | RX21 | RX31 | RY31 | RX12 | RX22 | RX32 | RY32 | RX13 | RX23 | RX33 | RY33 |
| R12 | RY11 | RY21 | RX41 | RY41 | RY12 | RY22 | RX42 | RY42 | RY13 | RY23 | RX43 | RY43 |

| | | | |
|---|---|---|---|
| R21 → R31 | RX11 | RX12 | RX13 |
| R22 → R33 | RX21 | RX22 | RX23 |
| R23 → R35 | RX31 | RX32 | RX33 |
| R24 → R36 | RY31 | RY32 | RY33 |
| R25 → R32 | RY11 | RY12 | RY13 |
| R26 → R34 | RY21 | RY22 | RY23 |
| R27 → R37 | RX41 | RX42 | RX43 |
| R28 → R38 | RY41 | RY42 | RY43 |
| R41 | RD11 | RD12 | RD13 |
| R42 | RD21 | RD22 | RD23 |
| R43 → R51 | RD31 | RD32 | RD33 |
| R44 → R52 | RD41 | RD42 | RD43 |

FIG.6

| R11 | RY11 | RY21 | RX41 | RY41 | RY12 | RY22 | RX42 | RY42 | RY13 | RY23 | RX43 | RY43 |
|---|---|---|---|---|---|---|---|---|---|---|---|---|
| R12 | RX11 | RX21 | RX31 | RY31 | RX12 | RX22 | RX32 | RY32 | RX13 | RX23 | RX33 | RY33 |

| | | | |
|---|---|---|---|
| R21 → R31 | $\overline{RY11}$ | $\overline{RY12}$ | $\overline{RY13}$ |
| R22 → R33 | $\overline{RY21}$ | $\overline{RY22}$ | $\overline{RY23}$ |
| R23 → R35 | $\overline{RX41}$ | $\overline{RX42}$ | $\overline{RX43}$ |
| R24 → R36 | $\overline{RY41}$ | $\overline{RY42}$ | $\overline{RY43}$ |
| R25 → R32 | RX11 | RX12 | RX13 |
| R26 → R34 | RX21 | RX22 | RX23 |
| R27 → R37 | RX31 | RX32 | RX33 |
| R28 → R38 | RY31 | RY32 | RY33 |
| R41 | RD11 | RD12 | RD13 |
| R42 | RD21 | RD22 | RD23 |
| R43 → R52 | RD41 | RD42 | RD43 |
| R44 → R51 | RD31 | RD32 | RD33 |

FIG. 7

| | | | | | | | | | | | | |
|---|---|---|---|---|---|---|---|---|---|---|---|---|
| R11 | RY31 | RX12 | RX22 | RX32 | RY32 | RX13 | RX23 | RX33 | RY33 | RX14 | RX24 | RX34 |
| R12 | RY41 | RY12 | RY22 | RX42 | RY42 | RY13 | RY23 | RX43 | RY43 | RY14 | RY24 | RX44 |

| | | | |
|---|---|---|---|
| R21 → R31 | RY31 | RY32 | RY33 |
| R22 → R33 | RX12 | RX13 | RX14 |
| R23 → R35 | RX22 | RX23 | RX24 |
| R24 → R36 | RX32 | RX33 | RX34 |
| R25 → R32 | RY41 | RY42 | RY43 |
| R26 → R34 | RY12 | RY13 | RY14 |
| R27 → R37 | RY22 | RY23 | RY24 |
| R28 → R38 | RX42 | RX43 | RX44 |
| R41 | — | — | — |
| R42 | RD12 | RD13 | RD14 |
| R43 | — | — | — |
| R44 | — | — | — |

FIG.8

| | | | |
|---|---|---|---|
| → R31 | (RX31) | (RX32) | (RX33) |
| R21 → R33 | RY31 | RY32 | RY33 |
| R22 → R35 | RX12 | RX13 | RX14 |
| R23 → R36 | RX22 | RX23 | RX24 |
| → R32 | (RX41) | (RX42) | (RX43) |
| R25 → R34 | RY41 | RY42 | RY43 |
| R26 → R37 | RY12 | RY13 | RY14 |
| R27 → R38 | RY22 | RY23 | RY24 |
| R41 | — | — | — |
| R42 | — | — | — |
| R43 | — | — | — |
| R44 | — | — | — |

FIG.9

| | | | |
|---|---|---|---|
| → R31 | (RX21) | (RX22) | (RX23) |
| → R33 | (RX31) | (RX32) | (RX33) |
| R21 → R35 | RY31 | RY32 | RY33 |
| R22 → R36 | RX12 | RX13 | RX14 |
| → R32 | (RY21) | (RY22) | (RY23) |
| → R34 | (RX41) | (RX42) | (RX43) |
| R25 → R37 | RY41 | RY42 | RY43 |
| R26 → R38 | RY12 | RY13 | RY14 |
| R41 | RD21 | RD22 | RD23 |
| R42 | — | — | — |
| R43 | — | — | — |
| R44 | — | — | — |

FIG.10

|  |  |  |  |
|---|---|---|---|
| → R31 | (RX11) | (RX12) | (RX13) |
| → R33 | (RX21) | (RX22) | (RX23) |
| → R35 | (RX31) | (RX32) | (RX33) |
| R21 → R36 | RY31 | RY32 | RY33 |
| → R32 | (RY11) | (RY12) | (RY13) |
| → R34 | (RY21) | (RY22) | (RY23) |
| → R37 | (RX41) | (RX42) | (RX43) |
| R25 → R38 | RY41 | RY42 | RY43 |
| R41 | RD11 | RD12 | RD13 |
| R42 | RD21 | RD22 | RD23 |
| R43 → R51 | RD31 | RD32 | RD33 |
| R44 → R52 | RD41 | RD42 | RD43 |

FIG.12

| | X11 | X31 | Y11 | X41 | X12 | X32 | Y12 | X42 | X13 | X33 | Y13 | X43 |
|---|---|---|---|---|---|---|---|---|---|---|---|---|
| T21 | | | | | | | | | | | | |
| | X21 | Y31 | Y21 | Y41 | X22 | Y32 | Y22 | Y42 | X23 | Y33 | Y23 | Y43 |

| | RY11 | RX41 | RX12 | RX32 | RY12 | RX42 | RX13 | RX33 | RY13 | RX43 | RX14 | RX34 |
|---|---|---|---|---|---|---|---|---|---|---|---|---|
| R11 | | | | | | | | | | | | |
| | RY21 | RY41 | RX22 | RY32 | RY22 | RY42 | RX23 | RY33 | RY23 | RY43 | RX24 | RY34 |

| | | | |
|---|---|---|---|
| R21 | RY11 | RY12 | RY13 |
| R22 | RY21 | RY22 | RY23 |
| R23 | RX41 | RX42 | RX43 |
| R24 | RY41 | RY42 | RY43 |
| R25 | RX12 | RX13 | RX14 |
| R26 | RX22 | RX23 | RX24 |
| R27 | RX32 | RX33 | RX34 |
| R28 | RY32 | RY33 | RY34 |
| R41 | — | — | — |
| R42 | — | — | — |
| R43 | RD41 | RD42 | RD43 |
| R44 | RD31 | RD32 | RD33 |

FIG.13

| | | | |
|---|---|---|---|
| R21→R32 | RY11 | RY12 | RY13 |
| R22→R34 | RY21 | RY22 | RY23 |
| R23→R37 | RX41 | RX42 | RX43 |
| R24→R38 | RY41 | RY42 | RY43 |
| R25→R31 | (RX11) | RX12 | RX13 |
| R26→R33 | (RX21) | RX22 | RX23 |
| R27→R35 | (RX31) | RX32 | RX33 |
| R28→R36 | (RY31) | RY32 | RY33 |
| R41 | RD11 | RD12 | RD13 |
| R42 | RD21 | RD22 | RD23 |
| R43 | RD31 | RD32 | RD33 |
| R44 | RD41 | RD42 | RD43 |

FIG.15

| | | | |
|---|---|---|---|
| T01 | D11 | D12 | D13 |
| T02 | D21 | D22 | D23 |
| T03 | D31 | D32 | D33 |
| T04 | D41 | D42 | D43 |
| T11 | X11 | X12 | X13 |
| T12 | Y11 | Y12 | Y13 |
| T13 | X21 | X22 | X23 |
| T14 | Y21 | Y22 | Y23 |
| T15 | X31 | X32 | X33 |
| T16 | Y31 | Y32 | Y33 |
| T17 | X41 | X42 | X43 |
| T18 | Y41 | Y42 | Y43 |

| | | | | | | | | | | | | |
|---|---|---|---|---|---|---|---|---|---|---|---|---|
| T21 | X11 | X21 | X31 | X41 | X12 | X22 | X32 | X42 | X13 | X23 | X33 | X43 |
| T22 | Y11 | Y21 | Y31 | Y41 | Y12 | Y22 | Y32 | Y42 | Y13 | Y23 | Y33 | Y43 |

FIG.16

| | | | | | | | | | | | | |
|---|---|---|---|---|---|---|---|---|---|---|---|---|
| R11 | RX21 | RX31 | RX41 | RX12 | RX22 | RX32 | RX42 | RX13 | RX23 | RX33 | RX43 | RX14 |
| R12 | RY21 | RY31 | RY41 | RY12 | RY22 | RY32 | RY42 | RY13 | RY23 | RY33 | RY43 | RY14 |

| | | | |
|---|---|---|---|
| R31 | RX21 | RX22 | RX23 |
| R33 | RX31 | RX32 | RX33 |
| R35 | RX41 | RX42 | RX43 |
| R36 | RX12 | RX13 | RX14 |
| R32 | RY21 | RY22 | RY23 |
| R34 | RY31 | RY32 | RY33 |
| R37 | RY41 | RY42 | RY43 |
| R38 | RY12 | RY13 | RY14 |
| R41 | RD21 | RD22 | RD23 |
| R42 | RD31 | RD32 | RD33 |
| R43 | RD41 | RD42 | RD43 |
| R44 | RD12 | RD13 | RD14 |

…

DATA TRANSMISSION SYSTEM

BACKGROUND OF THE INVENTION

1. Field of the Invention

The present invention relates generally to a data transmission system. More specifically, the invention relates to a data transmission system employing QPSK (quadrature phase shift keying) modulation system and a BPSK (binary phase shift keying) modulation system as modulation system and employing a convolutional encoder and an error correcting decoder for error correction.

1. Description of the Related Art

A system size of Viterbi decoder which is to be employed for error correcting decoding of a convolution code affected by a transmission error, becomes greater according to increasing of constraint length. For example, the current maximum speed for decoding with a Viterbi decoder having constraint length K=7, is about 30 Mbps. By this maximum speed, information transmission speed is limited. In order to overcome this, it has been strongly demanded to realize a data transmission system, in which a plurality of convolutional encoders and Viterbi decoder for parallel process of information bit string to be transmitted.

FIGS. 14A and 14B are illustrations for explaining a construction of the conventional data transmission system, wherein FIG. 14A is a block diagram showing a construction of a modulating portion, and FIG. 14B is a block diagram showing construction of a demodulating portion.

The data transmission system is constructed with a modulating portion (see FIG. 14A) including encoders 101a to 101d, a parallel/serial converters (P/S) 102a and 102b, and a modulator 103. Furthermore, the data transmission system is constructed with a demodulating portion (see FIG. 14B) including a demodulator 104, serial/parallel converters (S/P) 105a and 105b and Viterbi decoders 107a to 107d. Hereinafter, detailed discussion will be given with respect to respective components.

The encoder 101a takes an information bit string T01 to be transmitted as input, performs convolutional encoding with a coding ratio of ½, and outputs coded bit string consisted of a bit string T11 and a bit string T12. The encoder 101b takes an information bit string T02, and outputs coded bit string consisted of a bit string T13 and a bit string T14. The encoder 101c takes a bit string T03 and outputs coded bit string consisted of a bit string T15 and a bit string T16. The encoder 101d takes an information bit string T04, performs convolutional encoding with a coding ratio of ½, and outputs coded bit string consisted of a bit string T17 and a bit string T18.

The P/S 102a takes the bit strings T11, T13, T15 and T17 output from the encoders 101a to 101d and performs parallel/serial conversion to output a bit string T21. On the other hand, the P/S 102b takes the bit strings T12, T14, T16 and T18 output from the encoders 101a to 101d and performs parallel/serial conversion to output a bit string T22.

The modulator 103 takes the bit strings T21 and T22 respectively output from the P/S 102a and 102b. These bit strings T21 and T22 are corresponded to respective of orthogonal axes for phase conversion into four phases to transmit a QPSK modulation signal T31 to a transmission line.

The demodulator 104 takes a reception signal transmitted through the transmission line (namely the modulation signal T31 transmitted through the transmission line), and outputs QPSK demodulation to output bit strings R11 and R12.

The S/P 105a takes the bit string R11 output from the demodulator 104 as input and performs serial/parallel conversion to output bit strings R31, R33, R35 and R36. Similarly, the S/P 105b takes the bit string R12 output from the demodulator 104 as input and performs serial/parallel conversion to output bit strings R32, R34, R37 and R38.

The Viterbi decoder 107a takes the bit strings R31 and R32 output from the SP's 105a and 105b as inputs and outputs bit string R41 through an error correcting decoding of the inputs. Similarly, the Viterbi decoder 107b takes the bit strings R33 and R34 and outputs bit string R42. The Viterbi decoder 107c takes the bit strings R35 and R37 and outputs bit string R43. The Viterbi decoder 107d takes the bit strings R36 and R38 and outputs bit string R44.

Next, discussion will be given for operation of the data transmission system.

At first, the operation in the modulating portion will be discussed with reference to FIG. 15. It is assumed that the four strings of information bit strings T01 to T04 to be transmitted are:

```
T01: D11, D12, D13, ...
T02: D21, D22, D23, ...
T03: D31, D32, D33, ...
T04: D41, D42, D43, ...
```

In the encoders 101a to 101d, respective input information bit strings T01 to T04 are convolutionally encoded, and encoded bit strings T11 to T18 are output. Here, respective bit strings are assumed to be:

```
T11: X11, X12, X13, ...
T12: Y11, Y12, Y13, ...
T13: X21, X22, X23, ...
T14: Y21, Y22, Y23, ...
T15: X31, X32, X33, ...
T16: Y31, Y32, Y33, ...
T17: X41, X42, X43, ...
T18: Y41, Y42, Y43, ...
```

The coded bit strings T11 to T18 output from the encoders 101a to 101d are input to the P/S 102a and 102b. The P/S 102a and 102b performs parallel/serial conversion of respective input encoded bit strings T11 to T18 and outputs the following bit strings T21 and T22.

```
T21: X11, X21, X31, X41, ...
T22: Y11, Y21, Y31, Y41, ...
```

The bit strings T21 and T22 output from respective P/S 102a and 102b are modulated by the modulator 103 to transmit a modulation signal T31 to the transmission line.

As set forth above, the modulation signal T31 transmitted from the modulating portion through the transmission line is input to the demodulating portion 104 as the reception signal R01 via the transmission line. Once the reception signal R01 is input, QPSK demodulation of the reception signal R101 is performed in the demodulator 104 for outputting the demodulated bit strings R11 and R12. The demodulated bit strings R11 and R12 output from the demodulator 104 are respectively input to the S/P 105a and 105b and then subject to serial/parallel conversion, and output as bit strings R31 to R38.

The bit strings R31 to R38 output from the S/P 105a and 105b are input to the Viterbi decoder 107a to 107d. In respective of the Viterbi decoder 107a to 107d, error correction decoding is performed with respect to the bit strings R31 to R38 to output bit strings R41 to R44 corresponding to four strings of the information bit strings T01 to T04 to be transmitted as set forth above.

In the foregoing demodulator 104, the QPSK demodulating system is a kind of an orthogonal demodulating system. In demodulation in the orthogonal modulation system, there is four phase ambiguity. Even when transmission error is ignored, the bit strings R11 and R12 as the outputs of the demodulator 104 do not always match with the bit strings T21 and T22 input to the modulator 103. For example, the bits of the bit strings R11 and R12 corresponding to the bits X11 and Y11 of the bit strings T21 and T22 are one of (X11, Y11), (Y11, X11), (X11, Y11) and (Y11, X11). As method for removing the four phase ambiguity, various systems have been proposed.

For example, Japanese Unexamined Patent Publication (Kokai) No. Showa 61-137447 discloses "Decoding System for Multi-phase PSK Signal" as applied to TDMA system. In the decoding system disclosed in this publication, a phase information in a preamble portion of a burst signal is used. On the other hand, in Japanese Unexamined Patent Publication No. Showa 60-038957, "Phase Ambiguity Elimination Circuit of Four Phase PSK Wave" has been disclosed.

In the conventional data transmission system as set forth above, order of the outputs of the serial/parallel converter 105a is not always matched with the order of the bit string T11, T13, T15 and T17 at the transmission side for ambiguity of frequency division phase in the S/P conversion. Therefore, there are four combinations of the bit strings in the shown example. This is true in the serial/parallel converter 105b.

FIG. 16 shows one example of respective outputs, in the case where a phase of a reference carrier wave of the demodulator and a phase of a carrier wave of the modulator are consistent, and a frequency division phases of the serial/parallels (S/P) are mutually shifted at the transmission side and the receiving side. It should be noted that in consideration of the transmission error, sign R is put for the receiving side bits.

As shown in FIG. 16, when an offset is present between the frequency division phases of the serial/parallel converter (S/P) at the transmission side and the receiving side, the order of the bit strings R31 to R38 can be differentiated from the order of the bit strings T11 to T18 in the transmission side as shown in FIG. 15. Even in this case, error correction is normally performed in the Viterbi decoders 107a to 107d. Accordingly, the bit strings R31 to R38 output from the serial/parallel converters 105a and 105b are subject error correcting decoding by the Viterbi decoders 107a to 107d as currently ordered. As a result, the bit strings R41 to R44 different from the order of the transmission side bit strings T01 to T04 shown in FIG. 15.

As set forth above, when respectively plurality of encoders and error correcting decoders are arranged in parallel, it is possible that the error correcting decoder outputs is differentiated from the order of the parallel data at the input side due to frequency division phase ambiguity in the S/P of the conventional data transmission system. This is because that even when the frequency dividing phases are differentiated between transmission side and the receiving side, error correction can be done constantly in respective of the error correcting decoders arranged in parallel and because that the frequency division phase ambiguity cannot be eliminated. In the conventional data transmission system, in which the order of the parallel data of the outputs of the error correcting decoders is differentiated from that of the transmission side, means for detecting error of the order of the bit string to change the order of the data to be consistent with that in the transmission side becomes necessary, to make the overall system larger.

SUMMARY OF THE INVENTION

Therefore, it is an object of the present invention to provide a data transmission system which can obtain outputs of the order of bit strings consistent with those input to encoders, even when bit strings are output in erroneous order due to frequency division phase ambiguity in S/P, with simple construction.

A data transmission system according to one aspect of the present invention, comprises:

encoding means for performing convolution encoding a plurality of information bit strings to be transmitted, per string and outputting encoded bit strings;

parallel/serial converting means for performing parallel/serial conversion for respective encoded bit strings from the encoding means;

modulation means for transmitting modulated signal by modulating outputs of the parallel/serial converting means to a transmission line;

demodulation means for demodulating respective of the modulated signal transmitted through the transmission line;

serial/parallel converting means for performing serial/parallel conversion for outputs of the demodulation means;

error correcting decoding means for performing error correcting decoding for respective decoded bit strings converted by the serial/parallel converting means and outputting decoded bit strings corresponding to a plurality of information bit strings;

bit arranging means for arranging respective encoded bit strings input to the parallel/serial converting means and respective decoded bit strings input to the error correcting decoding means for disabling error correction decoding in at least one of the error correcting decoding means, when erroneous bit strings are output due to frequency division phase ambiguity of the serial/parallel converting means; and shifting means for monitoring capability and incapability of error correcting decoding in the error correcting decoding means, shifting arrangement of respective decoded bit strings to be input to the error correcting decoding means when correction decoding is not possible, and establishing correspondence between arrangement of the decoded bit strings and arrangement of the information bit strings.

Preferably, the modulation means may modulate outputs of the parallel/serial converting means for transmitting an orthogonal modulation signal respectively corresponding to orthogonal axes, to the transmission line. The demodulation means may perform orthogonal demodulation for respective of the orthogonally modulated signal transmitted through the transmission line and outputs orthogonal demodulated signal corresponding to respective orthogonal axes.

In the preferred construction, the data transmission system further comprises selecting means for monitoring phases of the orthogonal modulation signal and the orthogonal demodulation signal and alternating arrangement of the decoded bit strings output from the error correcting decoding means to be consistent with the arrangement of the information bit strings when phase error is caused. Also, the error correcting decoding means is a Viterbi decoder and including monitoring means for monitoring asynchornous condition of the Viterbi decoder to make judgement that phase error is caused when asynchronous condition is detected. The monitoring means monitors pass metric condition in decoding process of the Viterbi decoder, and makes judgement of the phase error according to the pass metric condition.

The monitoring means may monitor a correlation value of data derived by re-encoding the decoded data and the input data to make judgement of the phase error according to the correlated value.

In practice, the encoding means comprises n in number of encoders performing convolutional encoding n (n≧3) strings of information bit strings to be transmitted, per string for outputting an encoded bit string consisted of first and second bit strings, the parallel/serial converting means comprises a first parallel/serial converter for performing parallel/serial conversion for a bit string group including each of first bit strings of strings excluding two strings, and first and second bit strings of one string of the excluded two strings, and a second parallel/serial converter for performing parallel/serial conversion for a bit string group including each of second bit strings of strings excluding two strings, and first and second bit strings of the other string of the excluded two strings, the serial/parallel converting means is constructed with first and second serial/parallel converter for performing serial/parallel conversion into bit string groups corresponding to respective bit groups input to the first and second parallel/serial converters, the shifting means is constructed with first and second phase shifters respectively shifting order of bit strings of the bit string group output from the first and second serial/parallel converters, the error correcting decoding means is constructed with n in number of error correcting decoder for performing error correcting decoding per string corresponding to each other among outputs of two bit string groups of the first and second phase shifters, and the selection means selects outputs error correcting decoders corresponding to two strings in the n strings.

The modulation means is a BPSK modulator performing BPSK modulation for the output of the parallel/serial converting means for feeding BPSK modulation signal to the transmission line;

the demodulating means is a BPSK demodulator performing BPSK demodulation for the BPSK modulated signal transmitted through the transmission line and outputting a decoded signal, the encoding means comprises n in number of encoders performing convolutional encoding n (n≧3) strings of information bit strings to be transmitted, per string for outputting an encoded bit string consisted of first and second bit strings, the parallel/serial converting means comprises a first parallel/serial converter for performing parallel/serial conversion for a bit string group including each of first bit strings of strings excluding two strings, and first and second bit strings of one string of the excluded two strings, and a second parallel/serial converter for performing parallel/serial conversion for a bit string group including each of second bit strings of strings excluding two strings, and first and second bit strings of the other string of excluded two strings, the serial/parallel converting means is constructed with first and second serial/parallel converter for performing serial/parallel conversion into bit string groups corresponding to respective bit groups input to the first and second parallel/serial converters, the shifting means is constructed with first and second phase shifters respectively shifting order of bit strings of the bit string group output from the first and second serial/parallel converters, and the error correcting decoding means is constructed with n in number of error correcting decoder for performing error correcting decoding per string corresponding to each other among outputs of two bit string groups of the first and second phase shifters.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 4 is a timing chart for explaining operation in the modulating portion of FIG. 1A;

FIG. 5 is a timing chart for explaining an operation in the case where a phase of a reference carrier wave in the demodulating portion of FIG. 1B is consistent with the phase of the carrier wave of the transmission side;

FIG. 6 is a timing chart for explaining operation in the case where the phase of the reference carrier wave in the demodulating portion of FIG. 1B is shifted with respect to the phase of the carrier wave for 90°, and the frequency division phases are consistent;

FIG. 7 is a timing chart for explaining the operation in the case where the frequency division phase in the demodulating portion of FIG. 1B is shifted for 3 bits.;

FIG. 8 is a timing chart for explaining operation in the case where a bit string is shifted for one column by phase shifters 6a and 6b in the demodulating portion in FIG. 1B;

FIG. 9 is a timing chart for explaining operation in the case where a bit string is shifted for two columns by phase shifters 6a and 6b in the demodulating portion in FIG. 1B;

FIG. 10 is a timing chart for explaining operation in the case where a bit string is shifted for three columns by phase shifters 6a and 6b in the demodulating portion in FIG. 1B;

FIG. 12 is a timing chart for explaining operation in the modulating portion of FIG. 11A;

FIG. 13 is a timing chart for explaining operation in the cause where a bit string is shifted by a phase shifter 6 in the demodulator of FIG. 11B;

FIG. 15 is a timing chart for explaining operation in the modulating portion of FIG. 14A; and FIG. 16 is a timing chart for explaining operation in the cause where the phase of the reference carrier wave in the demodulator of FIG. 14B is consistent with the phase of the carrier wave at the transmission side, and frequency division phase is shifted.

DESCRIPTION OF THE PREFERRED EMBODIMENT

The present invention will be discussed hereinafter in detail in terms of the preferred embodiments with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1A:
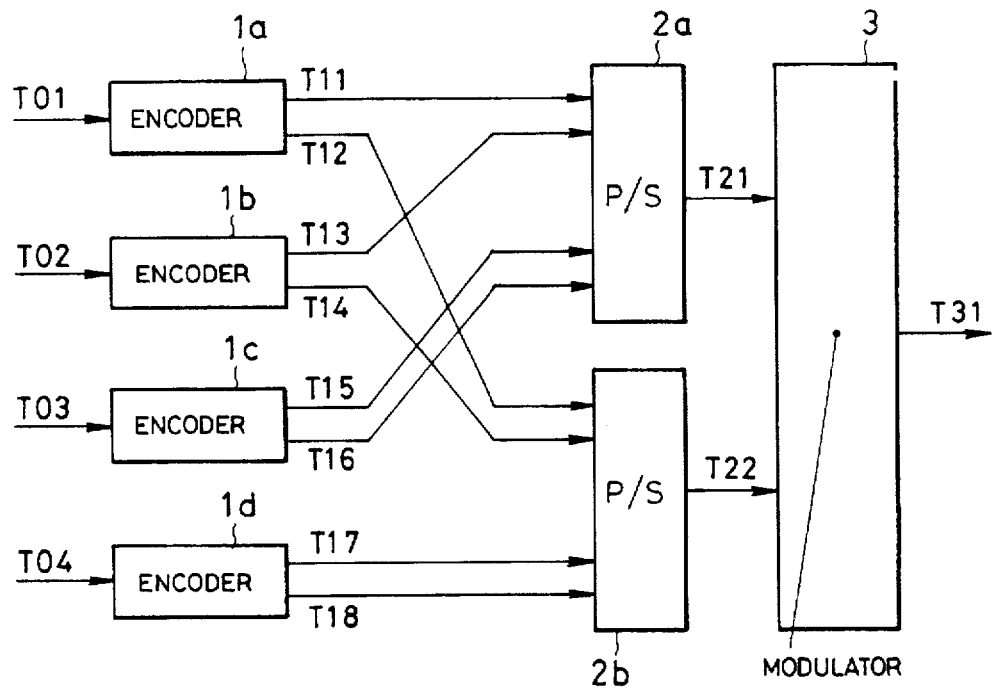
FIG. 1A is a block diagram showing a construction of a modulating portion of the first embodiment of a data transmission system according to the present invention.
Figure 1B:
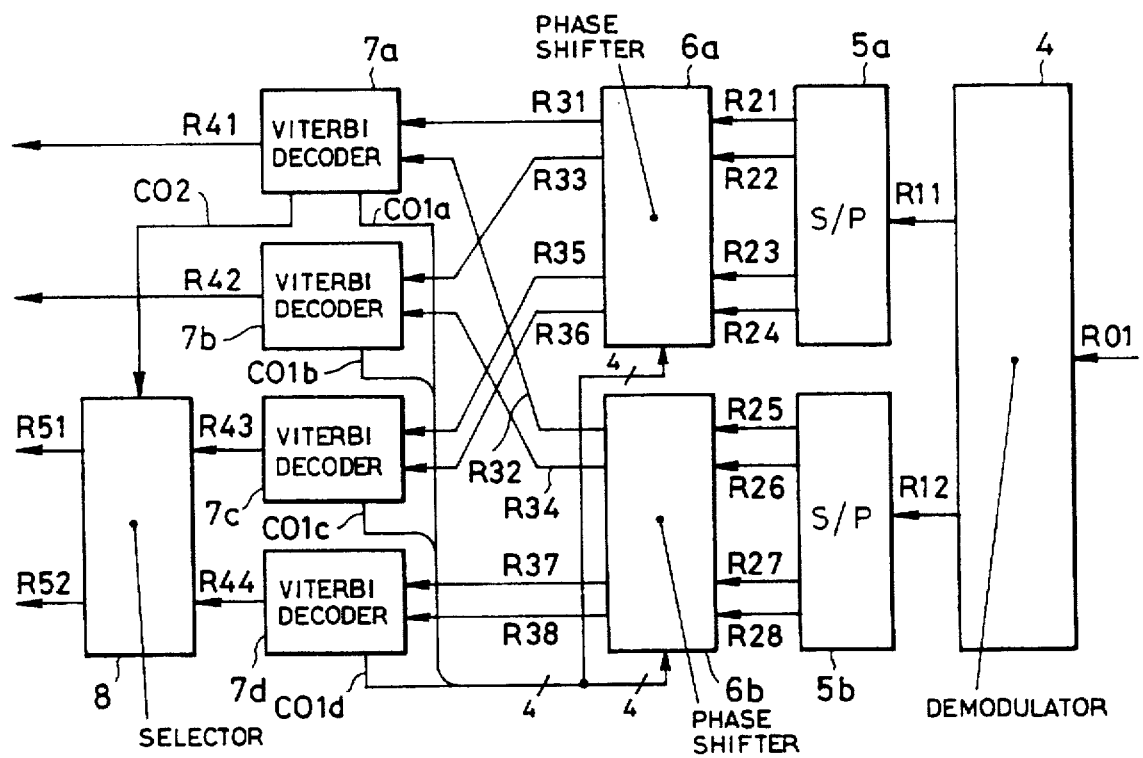
FIG. 1B is a block diagram showing a demodulating portion of the first embodiment of the data transmission system of the present invention.

FIG. 1A is a block diagram showing a construction of a modulating portion of the first embodiment of a data transmission system according to the present invention, and FIG. 1B is a block diagram showing a demodulating portion of the first embodiment of the data transmission system of the present invention.

The first embodiment of a data transmission system is constructed with a modulating portion which includes encoders 1a to 1d, parallel/serial converters (P/S) 2a and 2b, and a modulator 3, and a demodulating portion which includes a demodulator 4, serial/parallel converters (S/P) 5a and 5b, phase shifters 6a and 6b, and Viterbi decoders 7a to 7d. Detailed discussion for respective components will be given hereinafter.

The encoder 1a takes information bit string T01 to be transmitted as input, performs convolutional encoding with ½ of encoding ratio, and outputs to strings of coded bit strings T11 and T12. Similarly, the encoder 1b takes information bit string T02 and outputs to strings of coded bit strings T13 and T14. The encoder 1c takes information bit string T03 and outputs to strings of coded bit strings T15 and T16. The encoder 1d takes information bit string T04 and outputs to strings of coded bit strings T17 and T18.

The parallel/serial converter 2a takes the coded bit strings T11 and T13 output from the encoders 1a and 1b and coded bit strings T15 and T16 output from the encoders 1c, as inputs, and performs parallel/serial conversion to output a bit string T21. The parallel/serial converter 2b takes the coded bit strings T12 and T14 output from the encoders 1a and 1b and coded bit strings T17 and T18 output from the encoders 1d, as inputs, and performs parallel/serial conversion to output a bit string T22.

The modulator 3 takes the bit strings T21 and T22 respectively output from the parallel/serial converter 2a and 2b as inputs, performs orthogonal conversion for these to output modulation signal T31 for transmitting to a transmission line.

The demodulator 4 takes a reception signal R01 received through the transmission line (namely, the modulation signal T31 received through the transmission line), performs orthogonal demodulation, and outputs demodulated bit strings R11 and R12 respectively corresponding to the orthogonal axes.

The serial/parallel converter 5a takes the demodulated bit string R11 output from the demodulator 4 as input and performs serial/parallel conversion for outputting four strings of demodulated bit strings R21 to R24. The serial/parallel converter 5b takes the demodulated bit string R12 output from the demodulator 4 as input and performs serial/parallel conversion for outputting four strings of demodulated bit strings R25 to R28.

The phase shifter 6a takes demodulated bit strings R21 to R24 output from the serial/parallel converter 5a to output demodulated bit strings R31, R33, R35 and R36. The phase shifter 6b takes demodulated bit strings R25 to R28 output from the serial/parallel converter 5b to output demodulated bit strings R32, R34, R37 and R38.

Figure 2:
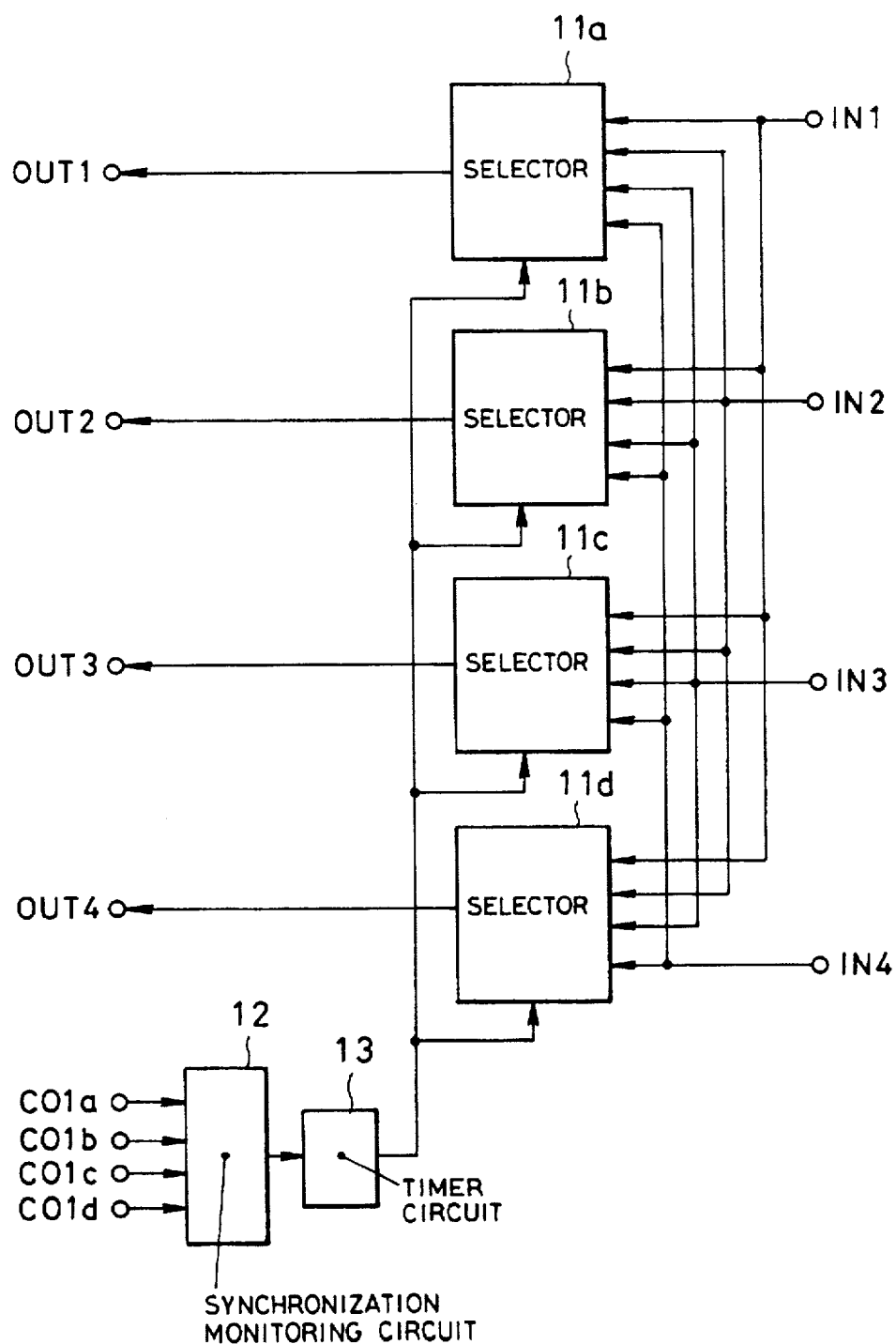
FIG. 2 is a block diagram of a phase shifters 6a and 6b.

FIG. 2 is an illustration showing a construction of the phase shifters 6a and 6b. The reference numerals 11a to 11d are selectors, 12 denotes a synchronization monitoring circuit and 13 denotes a timer circuit.

The phase shifters 6a and 6b respectively branch input bit strings IN1 to IN4 for supplying to all of the selectors 11a to 11d. On the other hand, Viterbi asynchronous signals C01a to C01d output from the Viterbi decoders 7a to 7d are supplied to a synchronization monitoring circuit 12. In the synchronization monitoring circuit 12, synchronization condition of all of the Viterbi decoders are checked. If there is at least one Viterbi demodulator in asynchronous condition, an asynchornous state signal is output to a timer circuit 13. Also, the synchronization monitoring circuit 12 can be easily realized with an AND circuit, OR circuit or so forth, for example. signal for outputting a selection control signal for the selectors 11a to 11d when the input signal (asynchronous state signal) is maintained for a period longer than a predetermined period. The selectors 11a to 11d are responsive to the selection control signal to switch the input bit strings to be output.

The Viterbi decoder 7a takes R31 and R32 output from the phase shifters 6a and 6b to make these as string pair corresponding to string pair at the transmission side, for performing Viterbi decoding to output R41 so that four phase ambiguity in the orthogonal modulation system is eliminated. Similarly, the Viterbi decoder 7b takes R33 and R34 output from the phase shifters 6a and 6b for performing Viterbi decoding to output R42. The Viterbi decoder 7c takes R35 and R36 output from the phase shifter 6a for performing Viterbi decoding to output R43. The Viterbi decoder 7d takes R37 and R38 output from the phase shifter 6b for performing Viterbi decoding to output R44.

Figure 3:
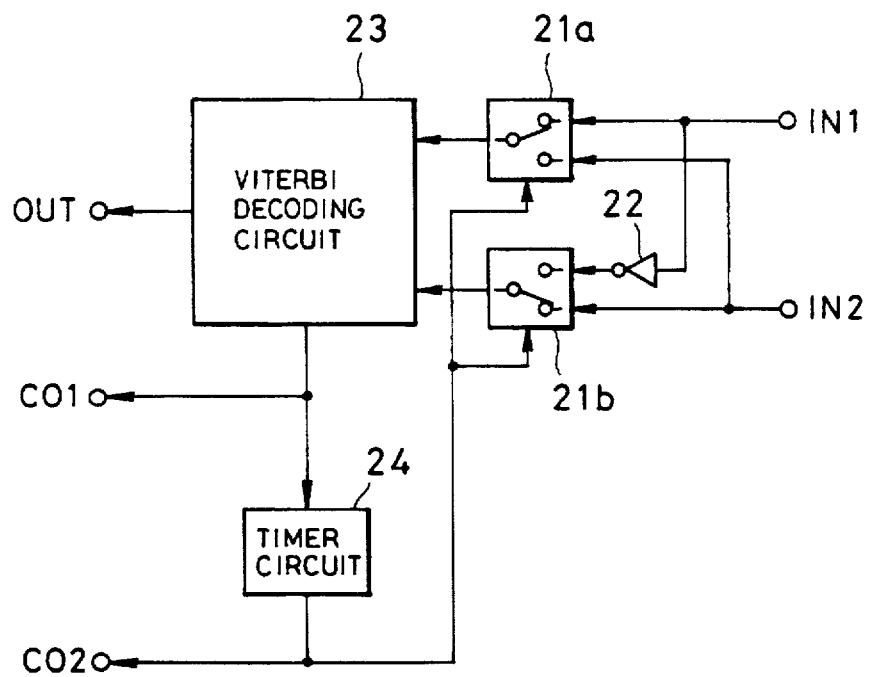
FIG. 3 is a block diagram of Viterbi decoders 7a to 7d.

FIG. 3 shows a construction of the Viterbi decoder 7a to 7d. The reference numerals 21a and 21b are selector, 22 denotes an inverter, 23 denotes a Viterbi decoding circuit, and 24 denotes a timer circuit.

In the Viterbi decoder, each of the input bit strings is branched into two strings. Respective branched bit strings are input to respective selectors 21a and 21b. At this time, only one of the branched string is inverted the data thereof by the inverter 22. The selector switches the data thereof by the inverter 22. The selector switches to select one of two input strings for outputting.

The Viterbi decoding circuit 23 takes output bit strings of the selectors 21a and 21b, and performs Viterbi decoding for outputting the decoded bit string. On the other hand, the Viterbi decoding circuit monitors Viterbi synchronization condition for outputting a Viterbi asynchronous signal C01 at the occurrence of asynchronous state. As means for obtaining the Viterbi asynchronous signal C01, a method paying attention to a pass metric state in the decoding process, a method paying attention between correlated value between the re-encoded value of the decoded data and the input data, or so forth are present.

When erroneous bit string can be output due to frequency division ambiguity of the serial/parallel conversion 5a and 5b, one of the Viterbi decoders 7a and 7b becomes a Viterbi decoding disabled state. This condition is input to respective phase shifter 6a and 6b by one of the asynchornous signals C01a to C01d.

On the other hand, the timer circuit 24 takes the asynchronous signal C01, and outputs a four phase determination signal C02 with judgement that the phase of the reference carrier wave of the demodulator 4 is differentiated from the phase of the carrier wave of the modulator if the asynchornous signals C01 is maintained for a period longer than or equal to a predetermined period. By this, the selector 21 is controlled to alternate the bit strings of the string pair (two inputs) input to the Viterbi circuit to establish the synchronous state.

By this, four phase ambiguity can be removed. At this condition, namely, the state where the four phase ambiguity is included in the input string pairs, is output from the Viterbi decoder 7a to the selector 8 by the four phase determining signal C02.

The selector 8 is designed not to switch the output bit strings R43 and R44 of the Viterbi decoders 7c and 7d on the basis of the four phase determining signal C02 output by the Viterbi decoder 7a when the carrier wave phase in transmission and reception are consistent or shifted for 180°, and to alter the bit strings R43 and R44 for outputting bit strings R51 and 52 when the carrier wave phase is shifted for ±90°.

Next, the operation of the data transmission system is explained in detail.

At first, the operation in the modulating portion will be discussed with reference to FIG. 4. It is assumed that four strings of the information bits T01 to T04 to be transmitted are:

```
T01: D11, D12, D13, ...
T02: D21, D22, D23, ...
T03: D31, D32, D33, ...
T04: D41, D42, D43, ...
```

The encoder 1a performs convolutional encoding of the information bit string T01 with encoding ratio ½. The encoded bit strings from two strings of bit strings T11 and T12 are output. Similarly, the encoder 1b outputs T13 and T14, the encoder 1c outputs T15 and T16, and the encoder 1d outputs T17 and T18. Each bit strings at this timer are assumed as:

```
T11: X11, X12, X13, ...
T12: Y11, Y12, Y13, ...
T13: X21, X22, X23, ...
T14: Y21, Y22, Y13, ...
T15: X31, X32, X33, ...
T16: Y31, Y32, Y33, ...
T17: X41, X42, X43, ...
T18: Y41, Y42, Y43, ...
```

The P/S 2a converts the bit strings T11, T13, T15 and T16 into the bit string T21, and the P/S 2b converts the bit strings T12, T14, T17 and T18 into the bit string T22. At this time, respective bit strings T21 and T22 are:

```
T21: X11, X21, X31, Y31, X12, X22, X32, ...
T22: Y11, Y21, X41, Y41, Y12, Y22, X42, ...
```

The modulator 3 performs QPSK modulation for the bit strings T21 and T22 to feed the QPSK modulation signal T31 corresponded to respective orthogonal axes to the transmission line.

Next, the operation of the demodulating portion for decoding the QPSK modulation signal T31 from the modulating portion as set forth above will be discussed with reference to FIGS. 5 to 10.

The demodulator 4 receives the reception signal R01 transmitted through the transmission line (namely, the modulation signal T31 received through the transmission line), performs QPSK demodulation to output demodulated bit signals R11 and R12. In these outputs, four phase ambiguity is included. When the phase of the reference carrier wave matches with the phase of the carrier wave of the modulator 3, as shown in FIG. 5, the modulated bit strings R11 and R12 are expressed by:

```
R11: RX11, RX21, RX31, RY31, RX12, ...
R12: RY11, RY21, RX41, RY41, RY12, ...
```

It should be noted that in consideration of the transmission error, sign R is put for the receiving side bits.

Once the bit strings R11 and R12 are output from the demodulator 4, then the S/P 5a converts the bit string R11 into R21 to R24. Similarly, the S/P 5b converts the bit string 12 into R25 to R28. Upon conversion, for R21 to R28 is frequency division phase ambiguity, the shown embodiment performs the following process.

(1) When the frequency divided phases are consistent between S/P 5a and 5b and the P/S 2a and 2b;

When the frequency divided phases are consistent between S/P 5a and 5b and the P/S 2a and 2b, respective decoded bit strings are expressed as follows (see FIG. 5):

```
R21: RX11, RX12, RX13, ...
R22: RX21, RX22, RX23, ...
R23: RX31, RX32, RX33, ...
R24: RY31, RY32, RY33, ...
R25: RY11, RY12, RY13, ...
R26: RY21, RY22, RY23, ...
R27: RX41, RX42, RX43, ...
R28: RY41, RY42, RY43, ...
```

In the phase shifters 6a and 6b, it is unnecessary to shift the bit strings of the S/Ps 5a and 5b because of fixing the frequency division phase. Thus, R31 to R38 are output as they are, as shown in FIG. 5. These pairs of decoded bit strings can be processed for Viterbi decoding in the Viterbi decoders 7a to 7d. Thus, decoded outputs R41 to R44 as shown in FIG. 5 can be obtained. In this example, since the phase of the reference carrier wave is fixed, the R41 to R44 are correctly decoded ignoring the transmission error. Therefore, the selector 8 outputs the input bit strings R43 and R44 as they are, as outputs R51 and R52.

(2) When the phase of the reference carrier wave of the decoder 4 is shifted from the phase of the carrier of the modulator for 90°, and the frequency division phase are consistent with the phases of the SPs 5a and 5b are consistent;

When the phase of the reference carrier wave of the decoder 4 is shifted from the phase of the carrier of the modulator for 90°, and the frequency division phase are consistent with the phases of the SPs 5a and 5b are consistent, the decoded outputs R11 and R12 are expressed as follows, as shown in FIG. 6:

| R11: $\overline{RY11}$, $\overline{RY21}$, $\overline{RX41}$, $\overline{RY41}$, ... |
|---|
| R12: RX11, RX21, RX31, RY31, ... |

The phase shifters 6a and 6b output the bit strings R31 to R38 without shifting the bit strings. At this time, the inputs to the Viterbi decoders 7a to 7d are respectively expressed as follows:

| R31: $\overline{RY11}$, $\overline{RY12}$, $\overline{RY13}$, ... |
|---|
| R32: RX11, RX12, RX13, ... |
| R33: $\overline{RX21}$, $\overline{RY22}$, $\overline{RY23}$, ... |
| R34: RX21, RX22, RX23, ... |
| R35: $\overline{RX41}$, $\overline{RX42}$, $\overline{RX43}$, ... |
| R36: RY41, RY42, RY43, ... |
| R37: RX31, RX32, RX33, ... |
| R38: RY31, RY32, RY33, ... |

Here, respective of the Viterbi decoders 7a to 7d monitor synchronization condition with bit error. If the asynchronous state is maintained, judgement is made that the phase of the reference carrier wave of the decoder 4 is differentiated from the phase of the carrier wave of the modulator 3 to alternate the bit strings of respective two inputs of the Viterbi decoders 7a to 7d for establishing the synchronous state, for example. By this, four phase ambiguity can be removed.

As a result, respective outputs of the Viterbi decoders 7a to 7d are expressed as:

| R41: RD11, RD12, RD13, ... |
|---|
| R42: RD21, RD22, RD23, ... |
| R43: RD41, RD42, RD43, ... |
| R44: RD31, RD32, RD33, ... |

Here, while respective Viterbi decoding is established, with respect to the bit strings R43 and R44, the order is differentiated from the bit strings T03 and T04 for the four phase ambiguity. In this case, by the selector 8, the bit string R43 is output as R52 and R44 is output as R51. By this, correct decoded bit string can be obtained. The selecting operation of the selector 8 is operated in response to the four phase fixed signal C02 which is output when the Viterbi decoder 7a operates for removing the four phase ambiguity.

(3) When frequency divided phase of the S/Ps 5a and 5b is differentiated from frequency divided phase of the P/Ss 2a and 2b:

When frequency divided phase of the S/Ps 5a and 5b is differentiated from frequency divided phase of P/Ss 2a and 2b, in either case that the reference carrier wave of the decoder 4 is consistent with the phase of the carrier wave of the modulator 3 or that the reference carrier wave of the decoder 4 is not consistent with the phase of the carrier wave of the modulator 3, fixing of the phase is done with respective Viterbi decoders 7a to 7d and the selector 8 as shown in FIG. 6. Therefore, process is the same in either case.

FIG. 7 shows the case where the frequency divided phase of the S/Ps 5a and 5b are shifted for three bits with respect to the frequency divided phase of the P/Ss 2a and 2b. At this time, the decoded outputs R11 and R12 are expressed as follows:

| R11: RY31, RX12, RX22, RX32, ... |
|---|
| R12: RY41, RY12, RY22, RX42, ... |

Here, it is assumed that the phase shifters 6a and 6b do not cause shifting of the bit strings and output bit strings R31 to R38. Then, the inputs for the Viterbi decoders 7a to 7d are expressed as follows:

| R31: RY31, RY32, RY33, ... |
|---|
| R32: RY41, RY42, RY43, ... |
| R33: RX12, RX13, RX14, ... |
| R34: RY12, RY13, RY14, ... |
| R35: RX22, RX23, RX24, ... |
| R36: RX32, RX33, RX34, ... |
| R37: RY22, RY23, RY24, ... |
| R38: RX42, RX43, RX44, ... |

At this time, concerning the Viterbi decoder 7a, the outputs R41 is obtained. However, other Viterbi decoders 7b to 7d are differentiated the pairs of bit strings of two inputs from the pairs of the encoders 1a to 1d. Thus, Viterbi decoding becomes impossible. Then, this fact is noticed as the Viterbi asynchronization signal C01 to the phase shifters 6a and 6b. It should be noted that, in respective of the Viterbi decoders 7a to 7d, when a period necessary for removing four phase ambiguity independently, is elapsed, and if Viterbi synchronization is not yet established, the Viterbi asynchronization signal C01 is output.

FIG. 8 shows the case where the phase shifters 6a and 6b causes shifted the bit strings for one string. Here, by the phase shifter 6a, the bit string R21 is shifted to R33, R22 is shifted to R35, and R23 is shifted to R36. Concerning R24, stored data of one preceding bit is shifted to R31. Similarly, by the phase shifter 6b, the bit string R25 is shifted to R34, R26 is shifted to R37, and R27 is shifted to R38. Concerning R28, data of one preceding bit is shifted to R32. At this time, all of the Viterbi decoders 7a to 7d are held disabled to perform decoding.

The phase shifting can be realized by storing bit information of past three parallel bits, in case that the bit strings are four parallel strings.

Furthermore, FIG. 9 shows the case where the phase shifters 6a and 6b causes phase shifting of the bit strings for one string in response to the Viterbi asynchronization signal C01.

In the phase shifter 6a, the bit string R21 is shifted to R35, R22 is shifted to R36. Concerning R23 and R24, stored data of one preceding bit are shifted to R31 and R33. Similarly, in the phase shifter 6b, the bit string R25 is shifted to R37, R26 is shifted to R38. Concerning R27 and R28, data of one preceding bit are shifted to R32 and R34. At this time, only Viterbi decoder 7a is enabled for decoding, and other Viterbi decoders 7b to 7d are disabled for decoding.

FIG. 10 shows the case where the phase shifters 6a and 6b further causes phase shifting of the bit strings for one string in response to the Viterbi asynchronization signal C01.

In the phase shifter 6a, the bit string R21 is shifted to R36. Concerning R22, R23 and R24, stored data of one preceding bit are shifted to R31, R33 and R35. Similarly, in the phase shifter 6b, the bit string R25 is shifted to R38. Concerning R26, R27 and R28, data of one preceding bit are shifted to R32, R34 and R37. At this time, all of Viterbi decoders 7a to 7d are enabled for decoding. The outputs R41 to R44 of respective Viterbi decoders 7a to 7d are expressed as:

```
R41: RD11, RD12, RD13, ...
R42: RD21, RD22, RD23, ...
R43: RD31, RD32, RD33, ...
R44: RD41, RD42, RD43, ...
```

The outputs R41 to R44 are concident with the bit strings T01 to T04 transmitted expect for transmission errors.

As set forth above, with the construction as shown in FIG. 1, by shifting the frequency division phases for establishing synchronization of all of a plurality of the Viterbi decoders arranged in parallel, frequency divided phase ambiguity in the S/Ps can be removed. On the other hand, it is possible to be adapted to alternating of the bit strings for removal of four phase ambiguity.

Next, discussion will be given with respect to the second embodiment of the data transmission system according to the present invention.

Figure 11A:
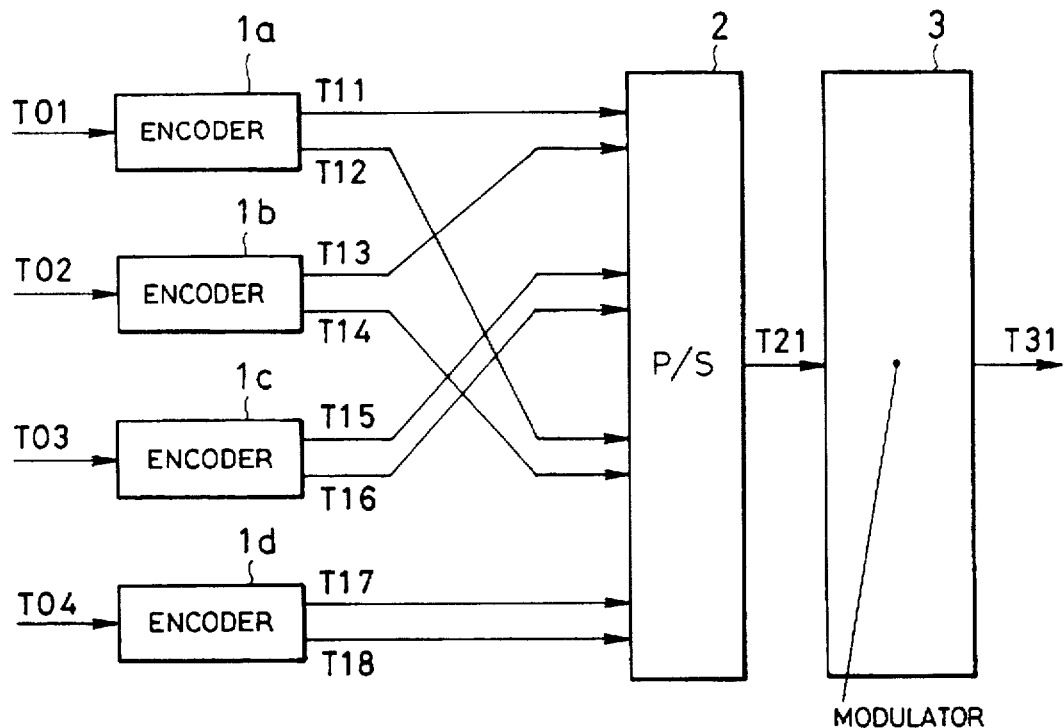
FIG. 11A is a block diagram showing a construction of the modulating portion of the second embodiment of the data transmission system according to the present invention.
Figure 11B:
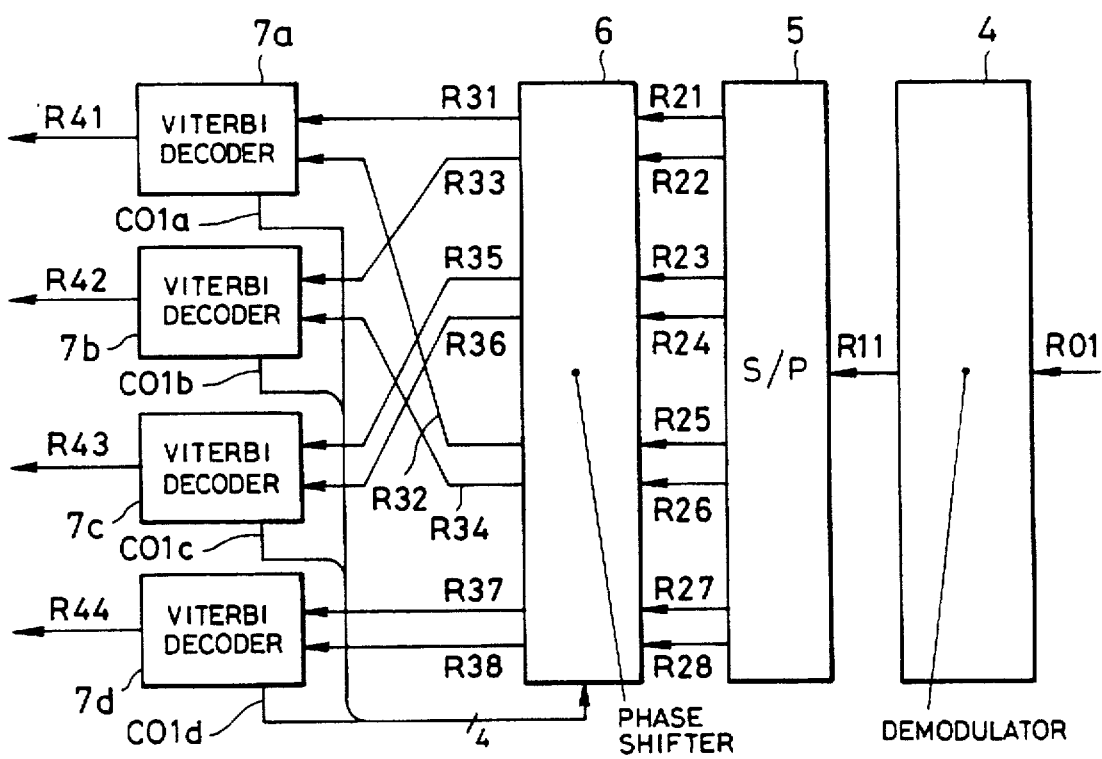
FIG. 11B is a block diagram showing a construction of the demodulating portion of the second embodiment of the data transmission system of the invention.
Figure 14A:
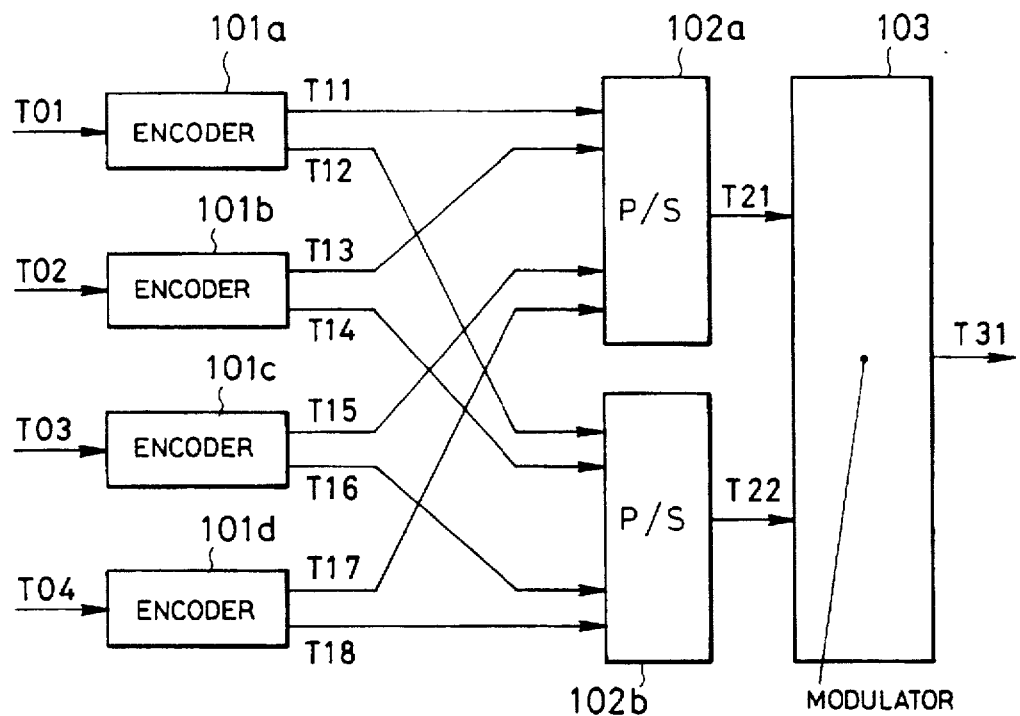
FIG. 14A is a block diagram showing a construction of the modulating portion of the conventional data transmission system.
Figure 14B:
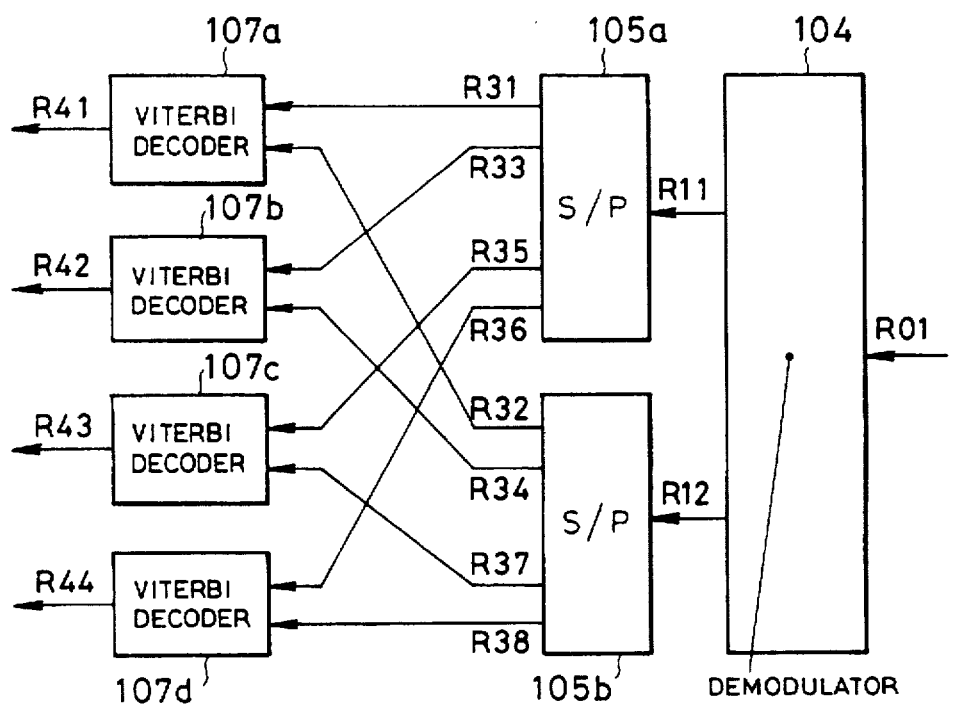
FIG. 14B is a block diagram showing a construction of the demodulating portion of the conventional data transmission system of the invention.

FIG. 11A is a block diagram showing a construction of the modulating portion of the second embodiment of the data transmission system according to the present invention, and FIG. 11B is a block diagram showing a construction of the demodulating portion of the second embodiment of the data transmission system of the invention.

The shown embodiment of the data transmission system has similar construction to that of the first embodiment of the data transmission system as illustrated in FIGS. 1A and 1B, except for P/Ss 2a and 2b of FIG. 1 is replaced with a P/S 2, the modulator 3 is replaced with a BPSK modulator 3, the demodulator 4 is replaced with a BPSK demodulator 4, the S/Ps 5a and 5b are replaced with a S/P 5, and the phase shifters 6a and 6b are replaced with a phase shifter 6, and the selector 8 is neglected. In the drawings, like elements are identified by like reference numerals.

The P/S 2 converts the bit strings T11 to T18 to the bit string T21. In case of the shown embodiment, the bit string T21 is expressed as shown in FIG. 12:

$$T21 = X11, X21, X31, Y31, X41, Y41, \ldots$$

The modulator 3 feeds the modulation signal T31 which is produced from the bit string T21 by BPSK modulation.

The demodulator 4 performs BPSK demodulation of the reception signal R01 received from the transmission line for outputting the demodulated bit string R11. The bit string R11 is converted into eight strings of bit strings R21 to R28 by the S/P 5. Here, the case where the frequency division phase of the S/P 5 is offset for four string, is shown in FIG. 12. If the phase shifter 6 does not cause shifting of the bit string, the Viterbi decoders 7c and 7d are enabled for decoding but the Viterbi decoders 7a and 7b are disabled for decoding for input bit strings disabling decoding. At this time, on the basis of the Viterbi asynchronization signal C01, the phase shifter 5 causes shifting of the bit strings in order. The phase shifter 6 repeats shifting of the bit strings until Viterbi synchronization is established.

Then, as shown in FIG. 13, R21 is shifted to R32, R22 is shifted to R34. In the similar manner, when R28 is shifted to R37, R24 is shifted to R38, R25 is shifted to R31, R26 is shifted to R33, R27 is shifted to R35 and R28 is shifted to R36, all of the Viterbi decoders 7a to 7d are enabled for decoding, respective bit strings R41 to R44 can be obtained. By this, except for the transmission error, the bit strings R41 to R44 are consistent with the bit strings T01 to T04 to be transmitted.

As set forth above, the first and second embodiments operate the Viterbi decoders 7a to 7d for four parallel strings.

Therefore, data transmission can be performed at a transmission speed four times of a limited speed due to decoding speed of the Viterbi decoders 7a to 7d. By increasing the encoders and the Viterbi decoders, further higher speed data transmission becomes possible.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

On the other hand, while the foregoing embodiments of the data transmission systems employ convolutional encoding with encoding ratio ½, the present invention is applicable for the case where the convolutional encoding with the encoding ratio other than ½.

Furthermore, respective embodiments of the data transmission systems are discussed in terms of the case where the Viterbi decoders are employed for performing error correction. However, the present invention is similarly applicable for the case where the other decoder for performing error correction of the convolutional code is employed.

Since the present invention is constructed as set forth above, means for alternating the bit strings for matching the order of the bit strings of the encoder inputs with detecting error of order of the bit strings after error correction, which has been required in the conventional system, becomes unnecessary. Thus, the present invention contributes for down-sizing of the system.

What is claimed is:

1. A data transmission system comprising:

encoding means for performing convolution encoding a plurality of information bit strings to be transmitted, per string and outputting encoded bit strings;

parallel/serial converting means for performing parallel/serial conversion for respective encoded bit strings from said encoding means;

modulation means for transmitting modulated signal by modulating outputs of said parallel/serial converting means to a transmission line;

demodulation means for demodulating respective of said modulated signal transmitted through said transmission line;

serial/parallel converting means for performing serial/parallel conversion for outputs of said demodulation means;

error correcting decoding means for performing error correcting decoding for respective decoded bit strings converted by said serial/parallel converting means and outputting decoded bit strings corresponding to a plurality of information bit strings;

bit arranging means for arranging respective encoded bit strings input to said parallel/serial converting means and respective decoded bit strings input to said error correcting decoding means for disabling error correction decoding in at least one of said error correcting decoding means, when erroneous bit strings are output due to frequency division phase ambiguity of said serial/parallel converting means; and shifting means for monitoring capability and incapability of error correcting decoding in said error correcting decoding means, shifting arrangement of respective decoded bit strings to be input to said error correcting decoding means when correction decoding is not possible, and establishing correspondence between arrangement of said decoded bit strings and arrangement of said information bit strings.

2. A data transmission system as set forth in claim 1, wherein said modulation means modulates outputs of said parallel/serial converting means for transmitting an orthogonal modulation signal respectively corresponding to orthogonal axes, to said transmission line.

3. A data transmission system as set forth in claim 2, wherein said demodulation means performs orthogonal demodulation for respective of said orthogonally modulated signal transmitted through said transmission line and outputs orthogonal demodulated signal corresponding to respective orthogonal axes.

4. A data transmission system as set forth in claim 3, which further comprises selecting means for monitoring phases of said orthogonal modulation signal and said orthogonal demodulation signal and alternating arrangement of the decoded bit strings output from said error correcting decoding means to be consistent with the arrangement of said information bit strings when phase error is caused.

5. A data transmission system as set forth in claim 4, wherein said error correcting decoding means is a Viterbi decoder and including monitoring means for monitoring asynchornous condition of said Viterbi decoder to make judgement that phase error is caused when asynchronous condition is detected.

6. A data transmission system as set forth in claim 5, wherein said monitoring means monitors pass metric condition in decoding process of said Viterbi decoder, and makes judgement of the phase error according to the pass metric condition.

7. A data transmission system as set forth in claim 5, wherein said monitoring means monitors a correlation value of data derived by re-encoding the decoded data and the input data to make judgement of the phase error according to said correlated value.

8. A data transmission system as set forth in claim 4, wherein said encoding means comprises n in number of encoders performing convolutional encoding n (n≧3) strings of information bit strings to be transmitted, per string for outputting an encoded bit string consisted of first and second bit strings, said parallel/serial converting means comprises a first parallel/serial converter for performing parallel/serial conversion for a bit string group including each of first bit strings of strings excluding two strings, and first and second bit strings of one string of said excluded two strings, and a second parallel/serial converter for performing parallel/serial conversion for a bit string group including each of second bit strings of strings excluding two strings, and first and second bit strings of the other string of said excluded two strings, said serial/parallel converting means is constructed with first and second serial/parallel converter for performing serial/parallel conversion into bit string groups corresponding to respective bit groups input to said first and second parallel/serial converters, said shifting means is constructed with first and second phase shifters respectively shifting order of bit strings of the bit string group output from said first and second serial/parallel converters, said error correcting decoding means is constructed with n in number of error correcting decoder for performing error correcting decoding per string corresponding to each other among outputs of two bit string groups of said first and second phase shifters, and said selection means selects outputs error correcting decoders corresponding to two strings in said n strings.

9. A data transmission system as set forth in claim 1, wherein said modulation means is a BPSK (binary phase shift keying) modulator performing BPSK modulation for the output of said parallel/serial converting means for feeding BPSK modulation signal to said transmission line;

said demodulating means is a BPSK demodulator performing BPSK demodulation for said BPSK modulated signal transmitted through said transmission line and outputting a decoded signal, said encoding means comprises n in number of encoders performing convolutional encoding n (n≧3) strings of information bit strings to be transmitted, per string for outputting an encoded bit string consisted of first and second bit strings, said parallel/serial converting means comprises a first parallel/serial converter for performing parallel/serial conversion for a bit string group including each of first bit strings of strings excluding two strings, and first and second bit strings of one string of said excluded two strings, and a second parallel/serial converter for performing parallel/serial conversion for a bit string group including each of second bit strings of strings excluding two strings, and first and second bit strings of the other string of said excluded two strings, said serial/parallel converting means is constructed with first and second serial/parallel converter for performing serial/parallel conversion into bit string groups corresponding to respective bit groups input to said first and second parallel/serial converters, said shifting means is constructed with first and second phase shifters respectively shifting order of bit strings of the bit string group output from said first and second serial/parallel converters, and said error correcting decoding means is constructed with n in number of error correcting decoder for performing error correcting decoding per string corresponding to each other among outputs of two bit string groups of said first and second phase shifters.

10. A data transmission system as set forth in claim 3, wherein said modulation means is a QPSK modulator and said demodulation means is a QPSK demodulator.

* * * * *